US011257659B1

(12) United States Patent
Chen et al.

(10) Patent No.: US 11,257,659 B1
(45) Date of Patent: Feb. 22, 2022

(54) ELECTRODE ASSEMBLY, ELECTRONIC APPARATUS/DEVICE USING THE SAME, AND APPARATUS OF CHARGED-PARTICLE BEAM SUCH AS ELECTRON MICROSCOPE USING THE SAME

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/302,820

(22) Filed: May 12, 2021

Related U.S. Application Data

(60) Provisional application No. 63/087,238, filed on Oct. 4, 2020.

(51) Int. Cl.
| | |
|---|---|
| *H01J 37/28* | (2006.01) |
| *H01J 37/153* | (2006.01) |
| *H01J 37/147* | (2006.01) |
| *H01J 37/14* | (2006.01) |

(52) U.S. Cl.
CPC ............. *H01J 37/28* (2013.01); *H01J 37/14* (2013.01); *H01J 37/1474* (2013.01); *H01J 37/153* (2013.01); *H01J 2237/1532* (2013.01); *H01J 2237/1534* (2013.01)

(58) Field of Classification Search
CPC .. H01J 37/00; H01J 37/02; H01J 37/05; H01J 37/147; H01J 37/10; H01J 37/141; H01J 37/26; H01J 37/153; H01J 37/14; H01J 37/1474; H01J 2237/1532; H01J 2237/1534
USPC .............. 250/306, 307, 311, 396 R, 396 ML
See application file for complete search history.

(56) References Cited

U.S. PATENT DOCUMENTS

| | | | |
|---|---|---|---|
| 2005/0199827 A1* | 9/2005 | Nagano .................. | B82Y 10/00 250/492.1 |
| 2013/0075604 A1* | 3/2013 | Bean ..................... | H01J 37/226 250/306 |

* cited by examiner

*Primary Examiner* — Jason L McCormack
(74) *Attorney, Agent, or Firm* — George Guosheng Wang; United States Research and Patent Firm

(57) ABSTRACT

The present invention provides an electrode assembly comprising two or more electrodes arranged around a primary axis forming a non-cylindrical channel space. General electronic apparatus/device, particularly apparatus of charged-particle beam such as electron microscope, may use the electrode assembly to create an optimized pattern of electrical field within non-cylindrical channel space. When the electrode assembly is used as a beam deflector in a magnetic objective lens, the electrical field within the central channel space can be co-optimized with the magnetic field for reducing aberration(s) such as distortion, field curvature, astigmatism, and chromatic aberration, after the beam passes through the central channel space.

9 Claims, 22 Drawing Sheets

ELECTRODE ASSEMBLY, ELECTRONIC APPARATUS/DEVICE USING THE SAME, AND APPARATUS OF CHARGED-PARTICLE BEAM SUCH AS ELECTRON MICROSCOPE USING THE SAME

CROSS-REFERENCE TO RELATED APPLICATIONS

This application expressly claims the benefit under 35 U.S.C. Section 119(e) and Article 4 of the Stockholm Act of the Paris Convention for the Protection of Industrial Property of U.S. Provisional Patent Application No. 63/087,238, filed Oct. 4, 2020, entitled "Several Designs for Apparatus of Charged-Particle Beam and Methods Thereof," the entire disclosure of which is hereby incorporated by reference.

FIELD OF THE INVENTION

The present invention generally relates to an electrode assembly surrounding a central channel space with a non-cylindrical shape, an electronic apparatus/device using the same, and an apparatus of charged-particle beam such as electron microscope using the same. Although the invention will be illustrated, explained, and exemplified by electron microscopes, it should be appreciated that the present invention can also be applied to other fields, for example, electron beam recorder, electron beam lithography system, and the like.

BACKGROUND OF THE INVENTION

An electrode assembly is widely used in many electronic apparatus/device such as cathode-ray tube (CRT), electron microscope, electron beam lithography, and other analytical instruments. For example, an electrode assembly may be used as a deflector in apparatuses of charged-particle beam such as transmission electron microscope (TEM) and scanning transmission electron microscope (STEM). TEM and STEM are widely used in fields of medical diagnosis, biological research, material analysis, and semiconductor inspection etc. With their high-resolution image technique, TEM and STEM are used as a particularly important diagnostic tool to screen virus, human tissues at high magnification (the ultrastructural level) or material analysis, often in conjunction with other methods, particularly light microscopy, immunofluorescence techniques and PCR etc.

For example, TEM/STEM has great potential for diagnostic purposes when it (1) provides useful (complementary) information in the context of a carefully considered differential diagnosis; (2) provides an 'improved' diagnosis that results in better treatment strategies and; (3) is time & cost effective in respect to alternative techniques. For diagnostic purposes, solid tissues or virus sample can be prepared for TEM/STEM in the same way as other biological tissues. The samples are fixed in glutaraldehyde and osmium tetroxide then dehydrated and embedded in epoxy resin. The ultrathin sections may be collected on 3 mm copper (mesh) grids and stained with uranyl acetate and lead citrate to make the contents of the tissue or virus electron dense (and thus visible in the electron microscope).

An electron microscope typically includes a primary electron beam source, an accelerating anode, an objective lens for focusing the beam onto the specimen, and a plurality of deflectors that enable the positioning and scanning movement of the primary beam over the specimen. United States Patent Application 2004/0046125 by Chen discloses a swinging objective retarding immersion lens system and method therefore which provide a low voltage electron beam with high beam current, relatively high spatial resolution, a relatively large scan field, and high signal collection efficiency. The objective lens includes a magnetic lens for generating a magnetic field in the vicinity of the specimen to focus the particles of the particle beam on the specimen, an electrode having a potential for providing a retarding field to the particle beam near the specimen to reduce the energy of the particle beam when the beam collides with the specimen; a deflection system including a plurality of deflection units situated along the beam axis for deflecting the particle beam to allow scanning on the specimen with large area, at least one of the deflection units located in the retarding field of the beam, the remainder of the deflection units located within the central bore of the magnetic lens; and a annular detection unit with a relatively small aperture, located underneath the primary beam define aperture, to capture secondary electron (SE) and backscattered electrons (BSE). As shown in FIG. 1, electrode assembly 19 in a conventional deflector 18 includes two or more electrodes 20 (e.g. 12 electrodes 20a, 20b, 20c, 20d, 20e, 20f, 20g, 20h, 20i, 20j, 20k, and 20l) arranged around a primary axis (e.g. z axis). A central channel space 21 has a boundary surface 21S that is axially symmetrical around the primary axis. The boundary surface 21S is a single right cylindrical surface. In other words, all the round cross-sections of the central channel space 21 along planes in parallel with the x-y plane have a same diameter D.

However, there are some disadvantages associated with the conventional deflector 18 as shown in FIG. 1. For example, when the central channel space 21 is immersed in the magnetic field of a magnetic objective lens in an EM, the electrical field within the central channel space 21 may be co-optimized with the magnetic field. However, aberrations of the electron beam after it passes through the central channel space 21, including distortion, field curvature, astigmatism, and chromatic aberrations, remain a problem.

Advantageously, the present invention provides a solution to overcome the drawback in the current design of deflector.

SUMMARY OF THE INVENTION

One aspect of the present invention provides an electrode assembly comprising two or more electrodes arranged around a primary axis (e.g. z axis). A central channel space has a boundary surface that is axially symmetrical around the primary axis, and the boundary surface is different from a single right cylindrical surface. In other words, at least two round cross-sections of the central channel space along planes in parallel with the x-y plane have different diameters. Each of the electrodes has a body and a front face with a facial surface. The facial surface of each electrode overlaps (or conforms to) a portion of the boundary surface, and the entire body of each electrode remains outside the central channel space.

Another aspect of the present invention provides a general electronic apparatus/device comprising the electrode assembly as described above, such as cathode-ray tube (CRT), electron microscope, electron beam lithography, and analytical instruments.

A further aspect of the present invention provides an apparatus of charged-particle beam comprising a source of charged particles and a deflector. The source of charged particles is configured to emit a beam of charged particles along a primary axis (e.g. z axis). The deflector includes an electrode assembly as described above, and it is configured to deflect the beam when the beam travels through the central channel space.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and it is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Figure 1:
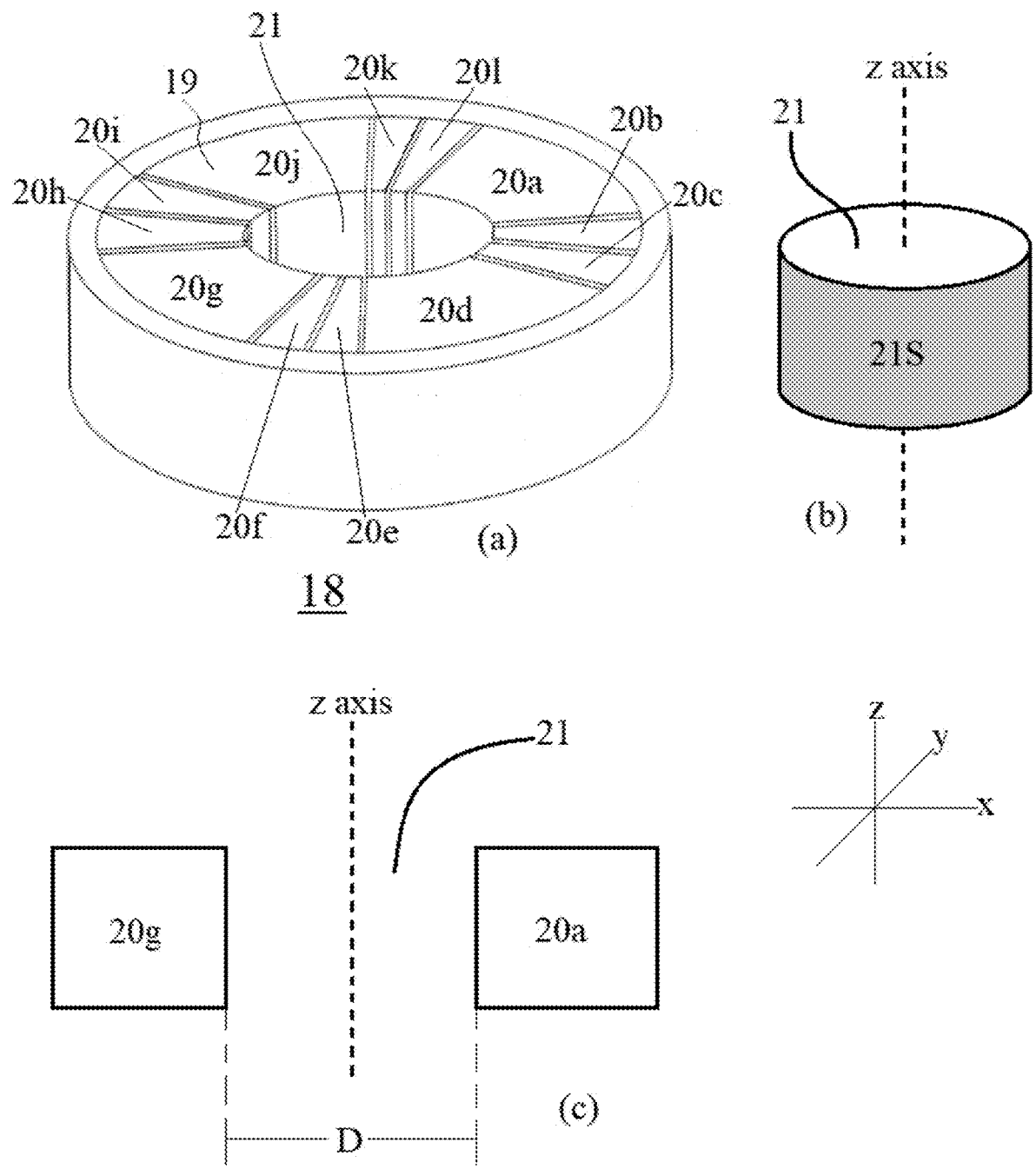
FIG. 1 shows an electrode assembly forming a cylindrical central channel space in the prior art.
Figure 2:
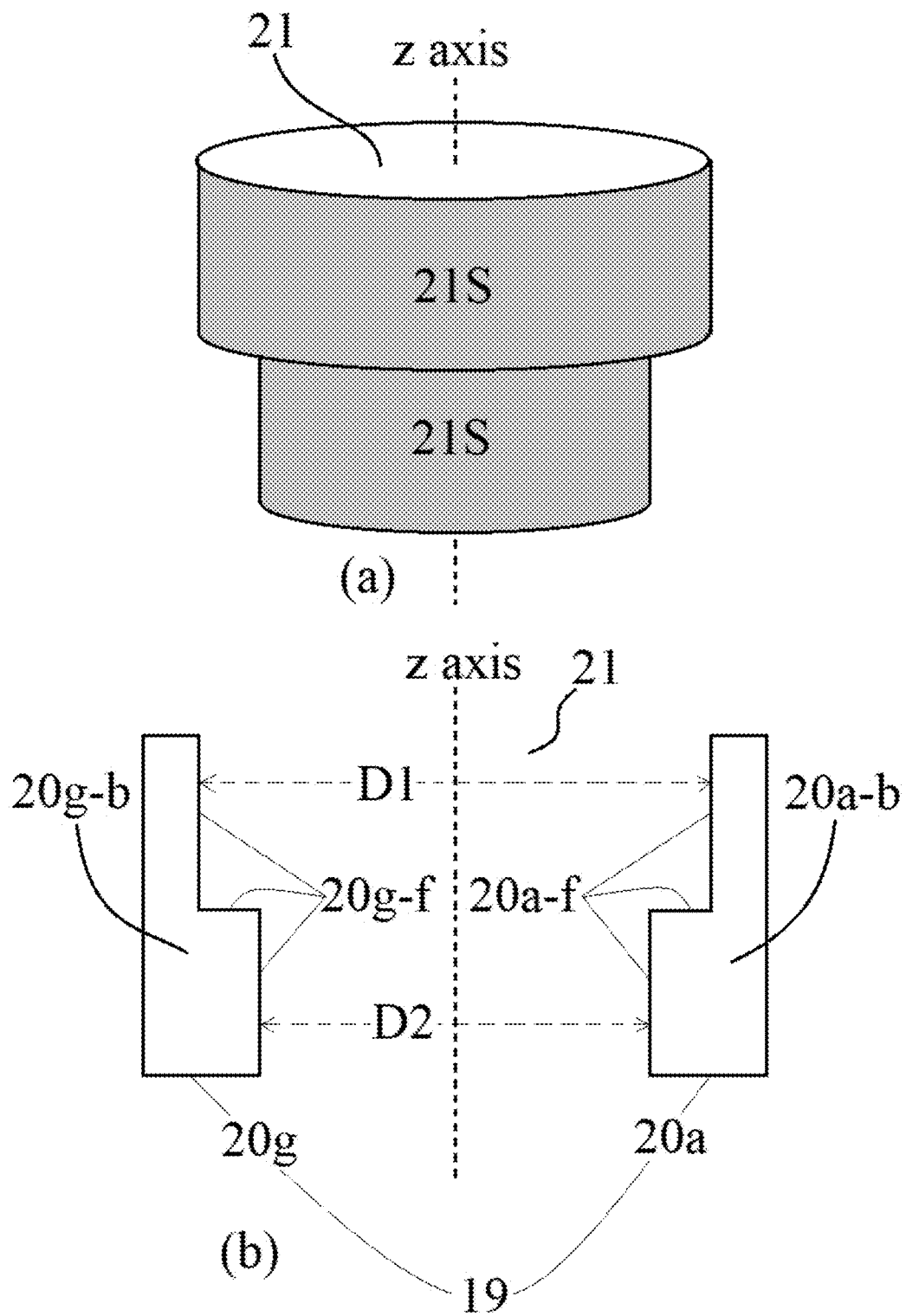
FIG. 2 schematically illustrates an electrode assembly forming a non-cylindrical central channel space in accordance with an exemplary embodiment of the present invention.

Referring to FIG. 2, various embodiments of the invention provide an electrode assembly 19 as an improvement over that as shown in FIG. 1. The electrode assembly 19 includes two or more electrodes 20 similar to that in FIG. 1 (e.g. 12 electrodes 20a, 20b, 20c, 20d, 20e, 20f, 20g, 20h, 20i, 20j, 20k and 20l) arranged around a primary axis, for example z axis or beam axis, and the x and y axes define a plane transverse to the z-axis. The two or more electrodes 20 may be made from conducting metal, such as copper or beryllium copper, and assembled and fixed onto a substrate made of a ceramic material such as approximately 95% to 98% alumina. Some of electrodes 20 may be grouped together and the group may be tied to a variable voltage driver. For example, when used as a deflector in an EM, the 12 electrodes 20 may be divided into 4 groups each comprising 3 electrodes. Two of the groups control deflection in the X direction and two of the groups control deflection in the Y direction. By controlling the voltage of these electrodes 20, the electron/particle beam is deflected away from some electrodes and towards other electrodes in a precise manner permitting accurate deflection of the beam. Alternatively, four groups of two or five electrodes (with a total of eight or twenty electrodes 20) may also be used.

Similar to FIG. 1, a central channel space 21 (or a central bore) has a boundary surface 21S that is axially symmetrical around the primary axis. However, the boundary surface 21S of the invention differs from a single right cylindrical surface. In other words, at least two round cross-sections of the central channel space 21 along planes in parallel with the x-y plane have different diameters, D1 and D2. For example, the central channel space 21a may function as a hollow channel/lumen for a particle beam such as an electron beam to travel or pass through.

Each of the electrodes (e.g. 20g and 20a) has a body 20g-b or 20a-b and a front face with a facial surface 20g-f or 20a-f. As such, the central channel space 21 is generally a non-cylindrical channel space. The facial surface of each electrode 20g-f or 20a-f overlaps (or conforms to) a portion of the boundary surface 21S, and the entire body of each electrode 20g-b or 20a-b remains outside the central channel space 21. The two or more electrodes 20 are separated with an insulating medium such as vacuum.

The non-cylindrical central channel space 21 may have a height H along the direction of the primary axis, and each facial surface 20-f (e.g. 20g-f and 20a-f) of the two or more electrodes 20 has a same height H along the direction of the primary axis.

Similarly to those in FIG. 1, two or more electrodes of the invention may also be in the form of n pairs of identical electrodes, and n≥1 or n≥2. In preferred embodiments of the invention, n=2, 4, 6, or 10. In other words, the electrode assembly 19 of the invention may consist of 4, 8, 12 or 20 electrodes 20. Two identical electrodes in a pair are opposite to each other across the primary axis. The two identical electrodes in a pair are axially symmetrical around the primary axis. For example, electrodes 20a and 20g, 20b and 20h, 20c and 20i, 20d and 20j, 20e and 20k, and 20f and 20l are 6 pairs of identical electrodes, and any two identical electrodes in a pair are opposite to each other across the primary axis, or they are axially symmetrical around the primary axis.

Figure 3:
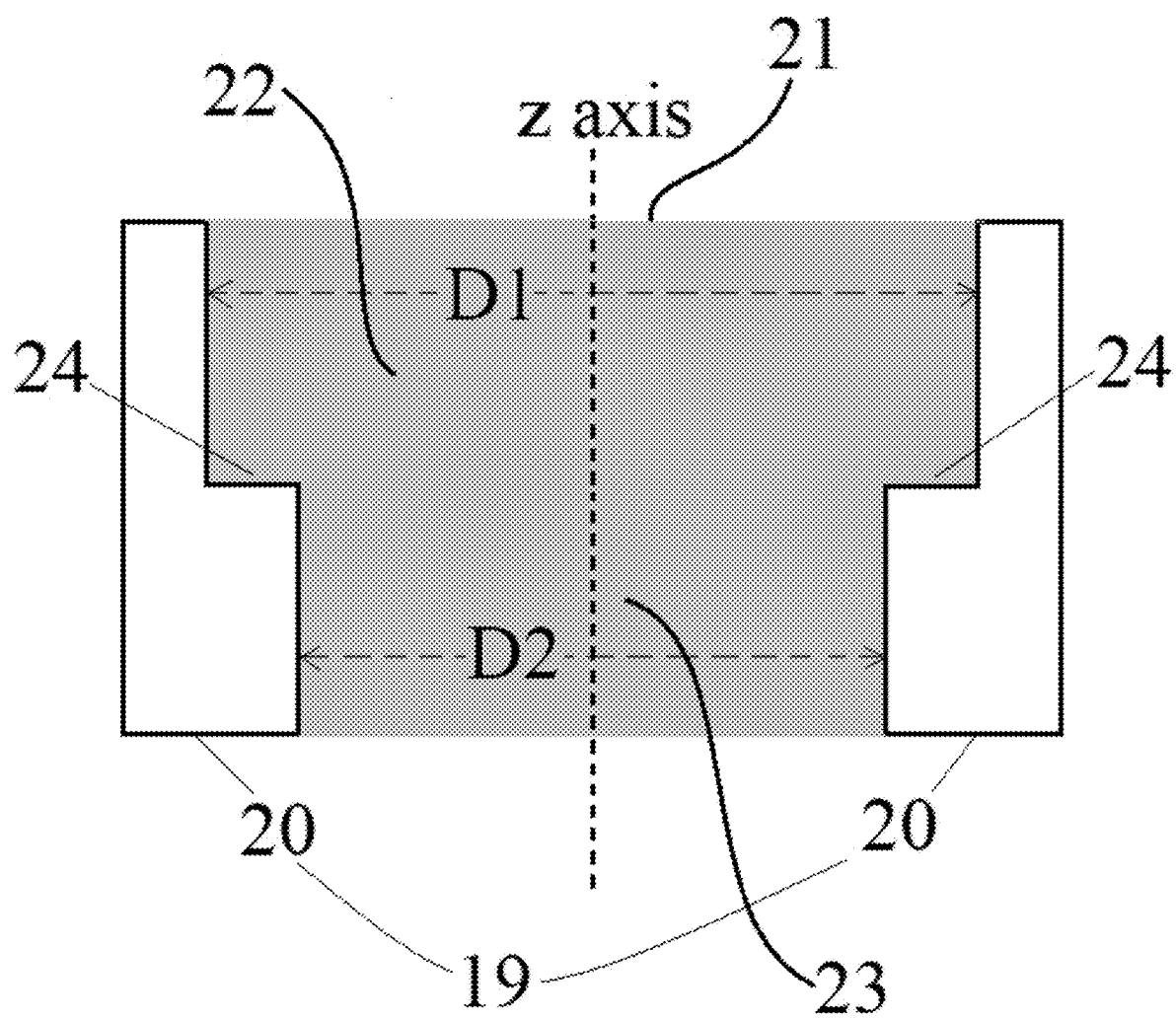
FIG. 3 schematically illustrates an electrode assembly forming a central channel space with a first non-cylindrical shape in accordance with an exemplary embodiment of the present invention.

In an exemplary embodiment of the invention as shown in FIG. 3, the non-cylindrical central channel space 21 consists of a first single right cylindrical segment 22 with a diameter D1, a second single right cylindrical segment 23 with a diameter D2, and a shoulder 24 in parallel to x-y plane connecting the first segment 22 to the second segment 23. D1>D2.

Figure 4:
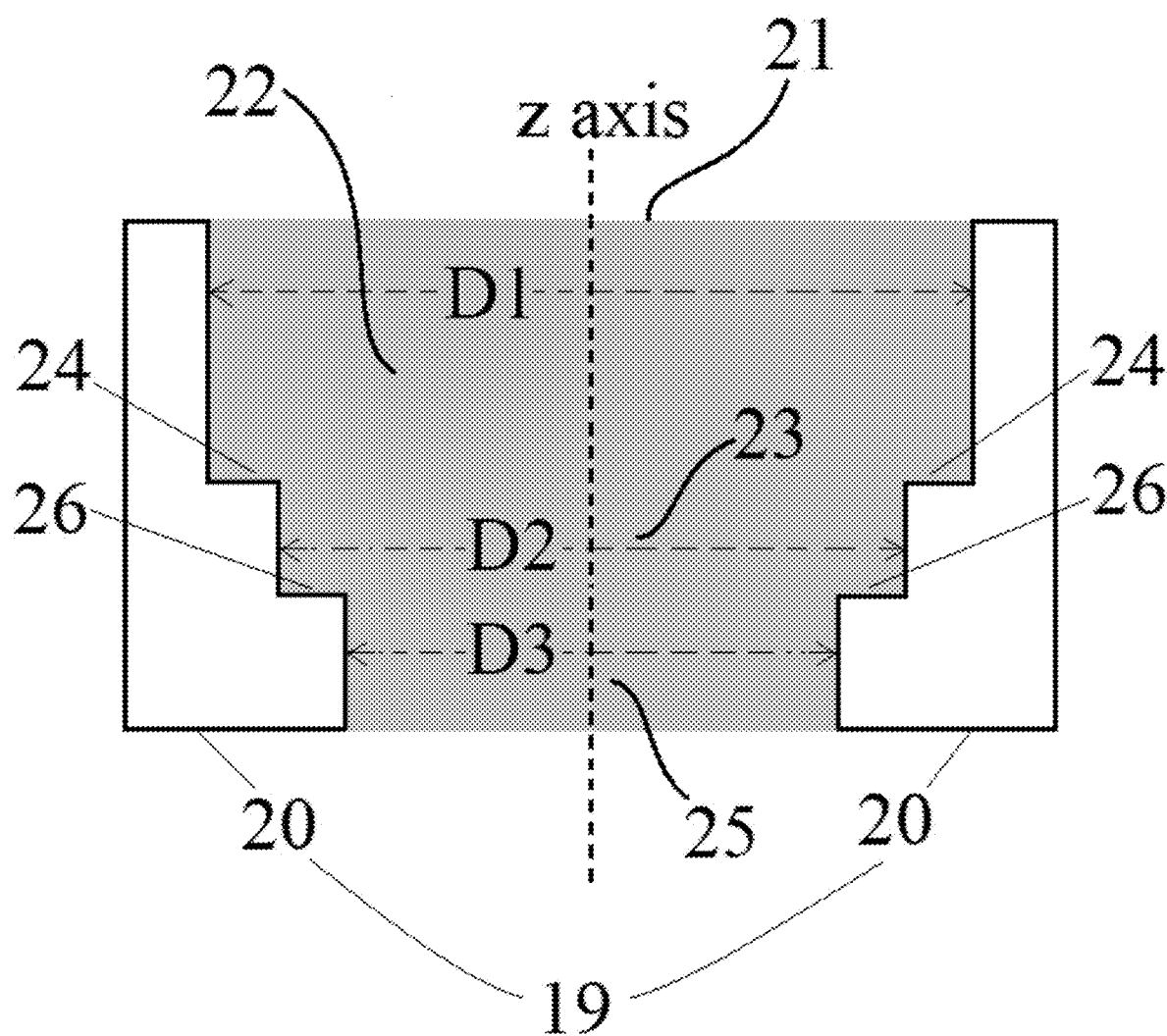
FIG. 4 schematically illustrates an electrode assembly forming a central channel space with a second non-cylindrical shape in accordance with an exemplary embodiment of the present invention.

In an exemplary embodiment of the invention as shown in FIG. 4, the non-cylindrical central channel space 21 consists of a first single right cylindrical segment 22 with a diameter D1, a second single right cylindrical segment 23 with a diameter D2, and a third single right cylindrical segment 25 with a diameter D3. A first shoulder 24 in parallel to x-y plane connects the first segment 22 to the second segment 23; and a second shoulder 26 in parallel to x-y plane connecting the second segment 23 to the third segment 25. D1>D2>D3.

Figure 5A:
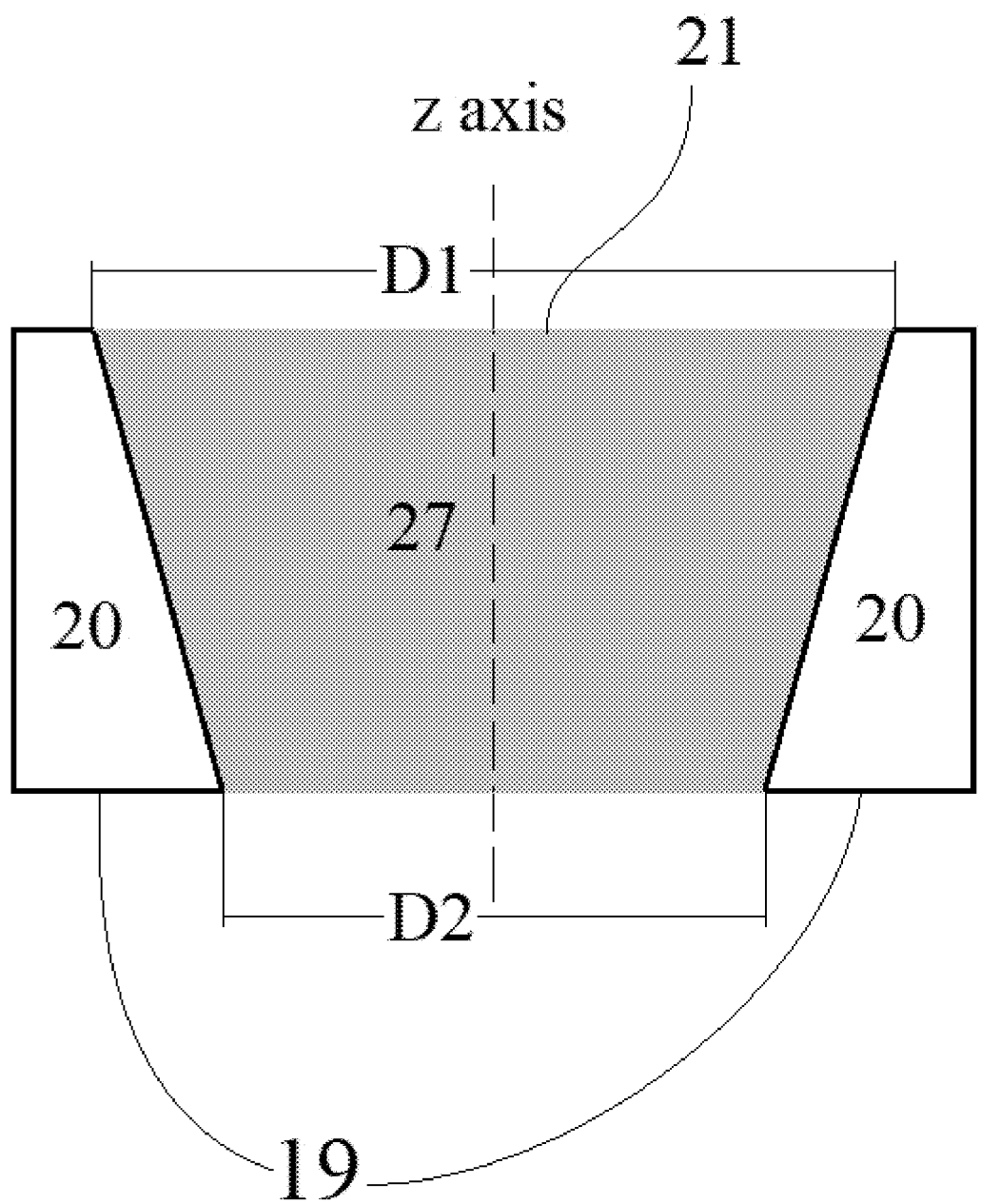
FIG. 5A schematically illustrates an electrode assembly forming a central channel space with a third non-cylindrical shape in accordance with an exemplary embodiment of the present invention.
Figure 5B:
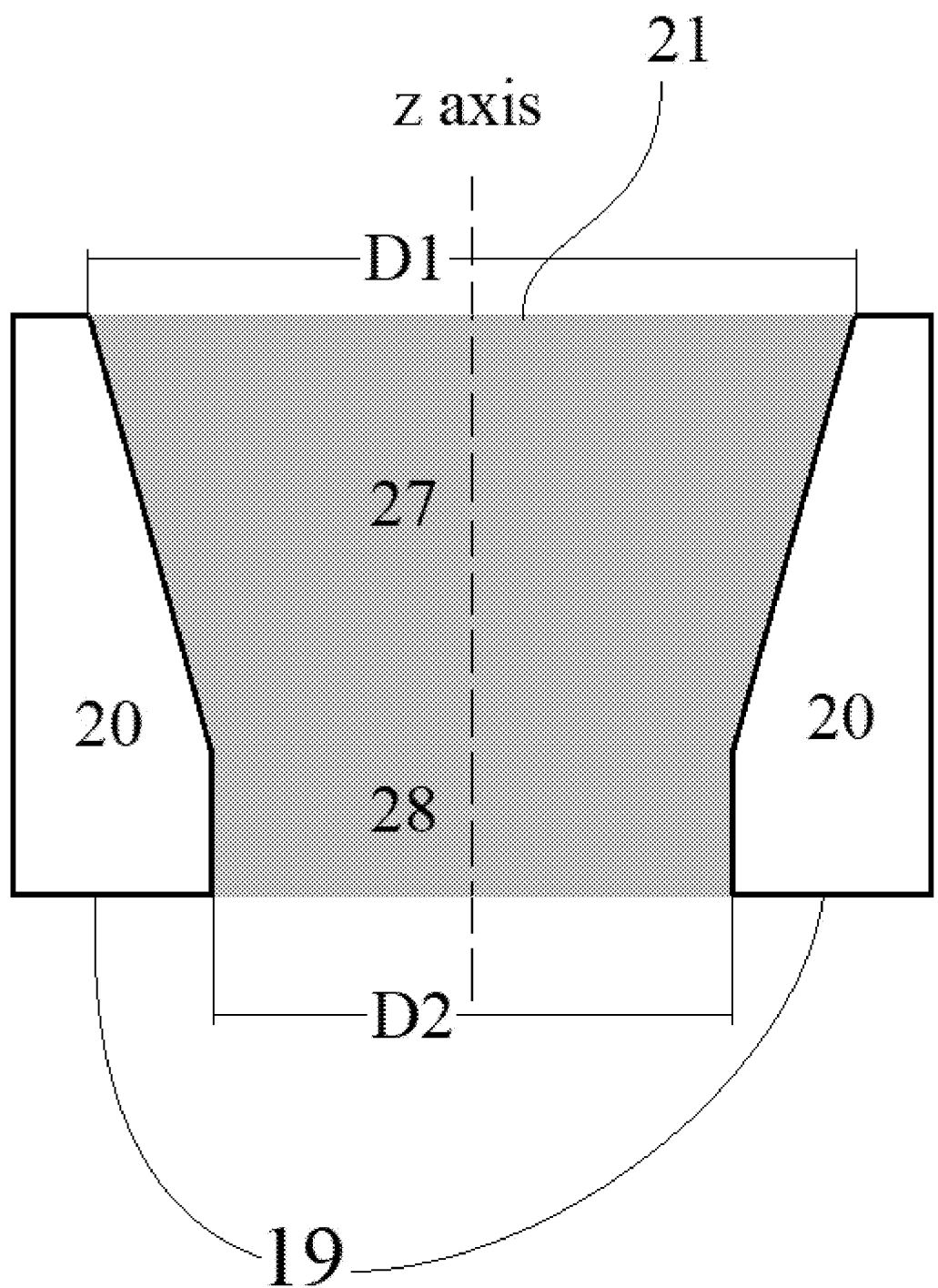
FIG. 5B schematically illustrates an electrode assembly forming a central channel space with a fourth non-cylindrical shape in accordance with an exemplary embodiment of the present invention.

In an exemplary embodiment of the invention as shown in FIG. 5A, the non-cylindrical central channel space 21 comprises (or consists of) a truncated cone segment 27 (or a straight funnel-shaped segment) with a diameter decreasing from D1 to D2, and D1>D2. Alternatively, as shown in FIG. 5B, the non-cylindrical central channel space 21 comprises (or consists of) a truncated cone segment 27 and a single right cylindrical segment 28 with a diameter D2, the former being continuously or seamlessly transitioned to the latter.

Figure 6A:
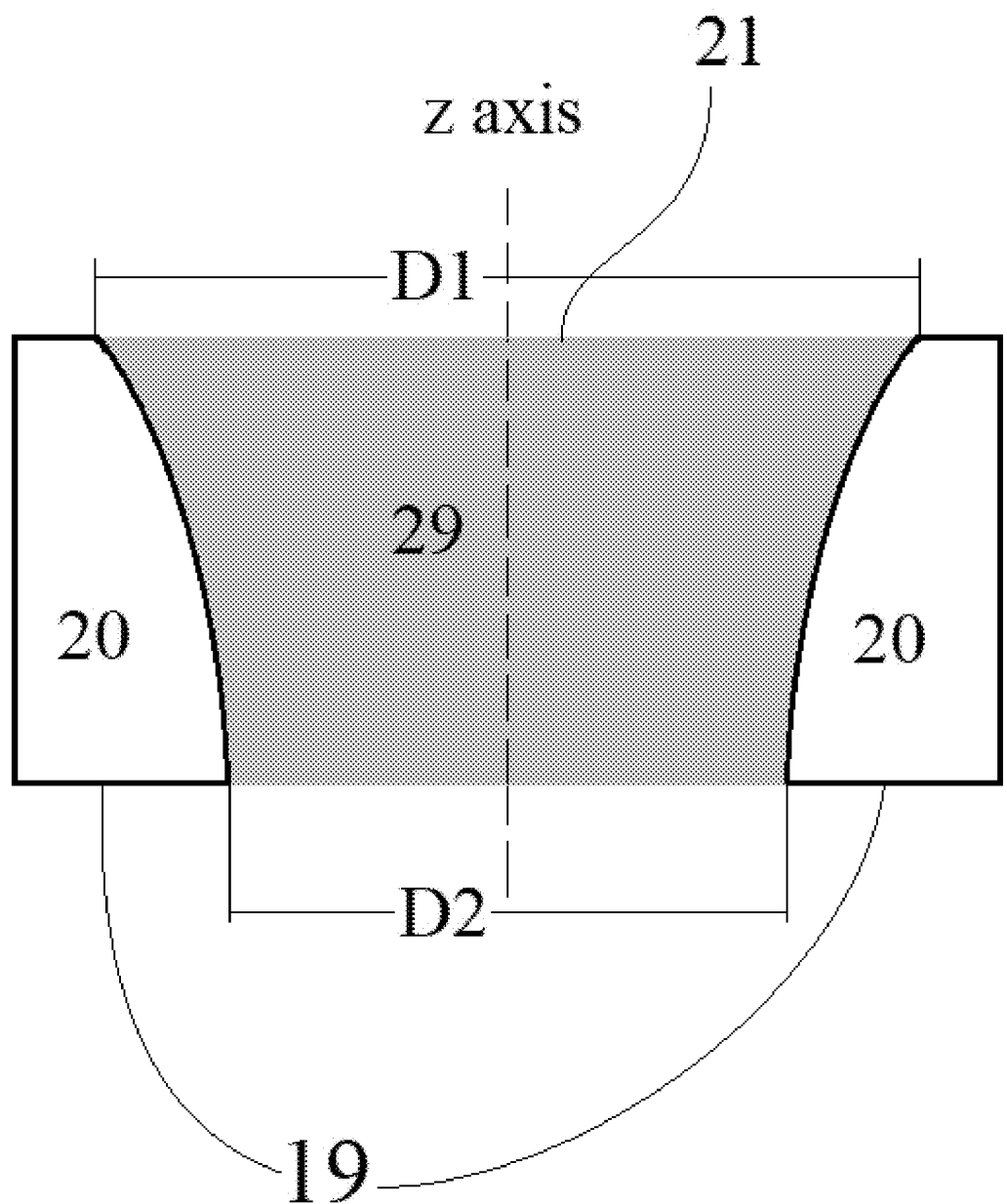
FIG. 6A schematically illustrates an electrode assembly forming a central channel space with a fifth non-cylindrical shape in accordance with an exemplary embodiment of the present invention.
Figure 6B:
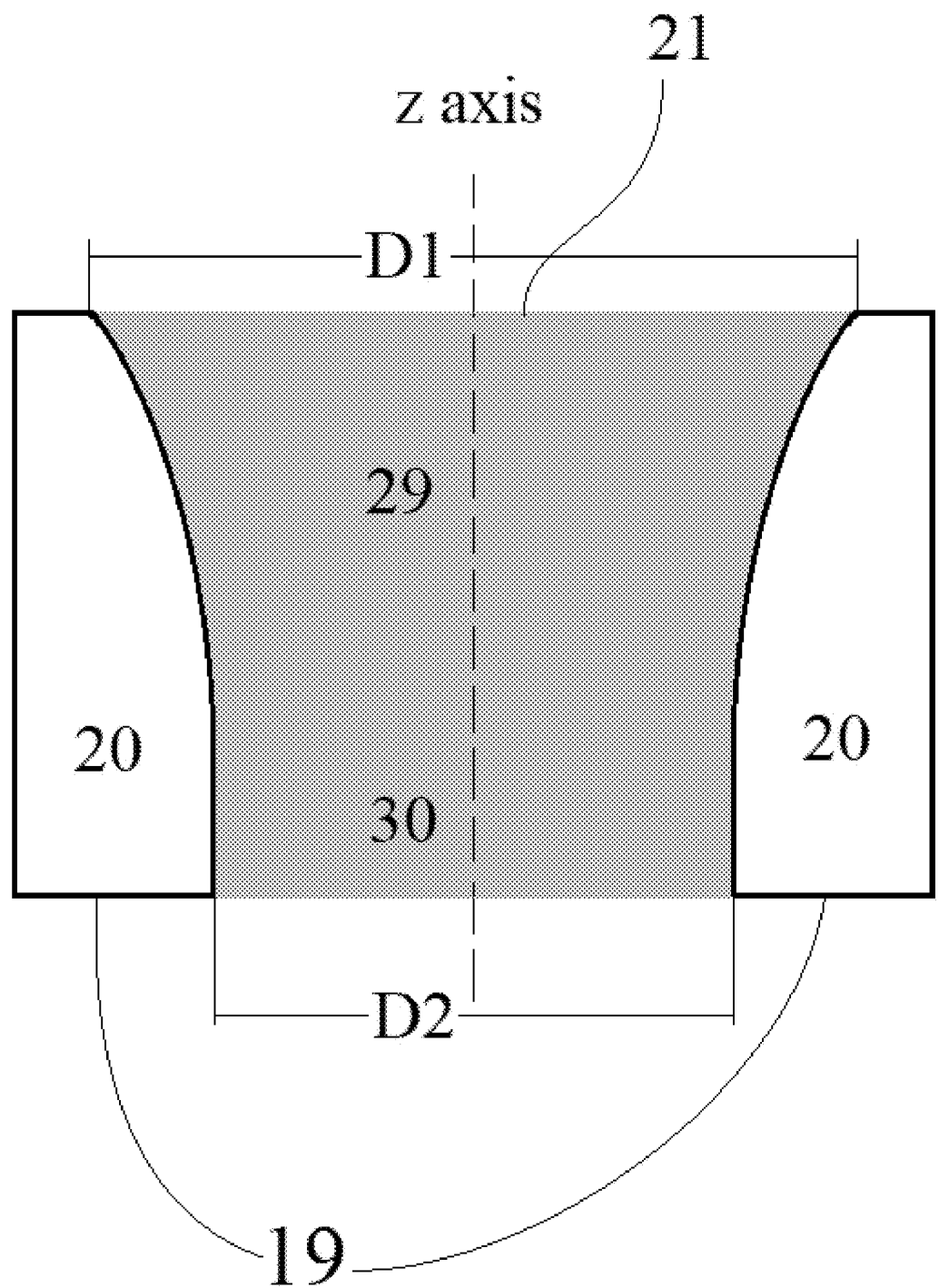
FIG. 6B schematically illustrates an electrode assembly forming a central channel space with a sixth non-cylindrical shape in accordance with an exemplary embodiment of the present invention FIG. 7 schematically illustrates a general electronic apparatus/device using an electrode assembly forming a non-cylindrical central channel space in accordance with an exemplary embodiment of the present invention.

In an exemplary embodiment of the invention as shown in FIG. 6A, the non-cylindrical central channel space 21 comprises (or consists of) a trumpet-shaped segment 29 (or a curved funnel-shaped segment)) with a diameter decreasing from D1 to D2, and D1>D2. For example, segment 29 may have a shape like a half of hyperboloid of one sheet. Alternatively, as shown in FIG. 6B, the non-cylindrical central channel space 21 comprises (or consists of) a trumpet-shaped segment 29 and a single right cylindrical segment 30 with a diameter D2, the former being continuously or seamlessly transitioned to the latter.

Figure 7:
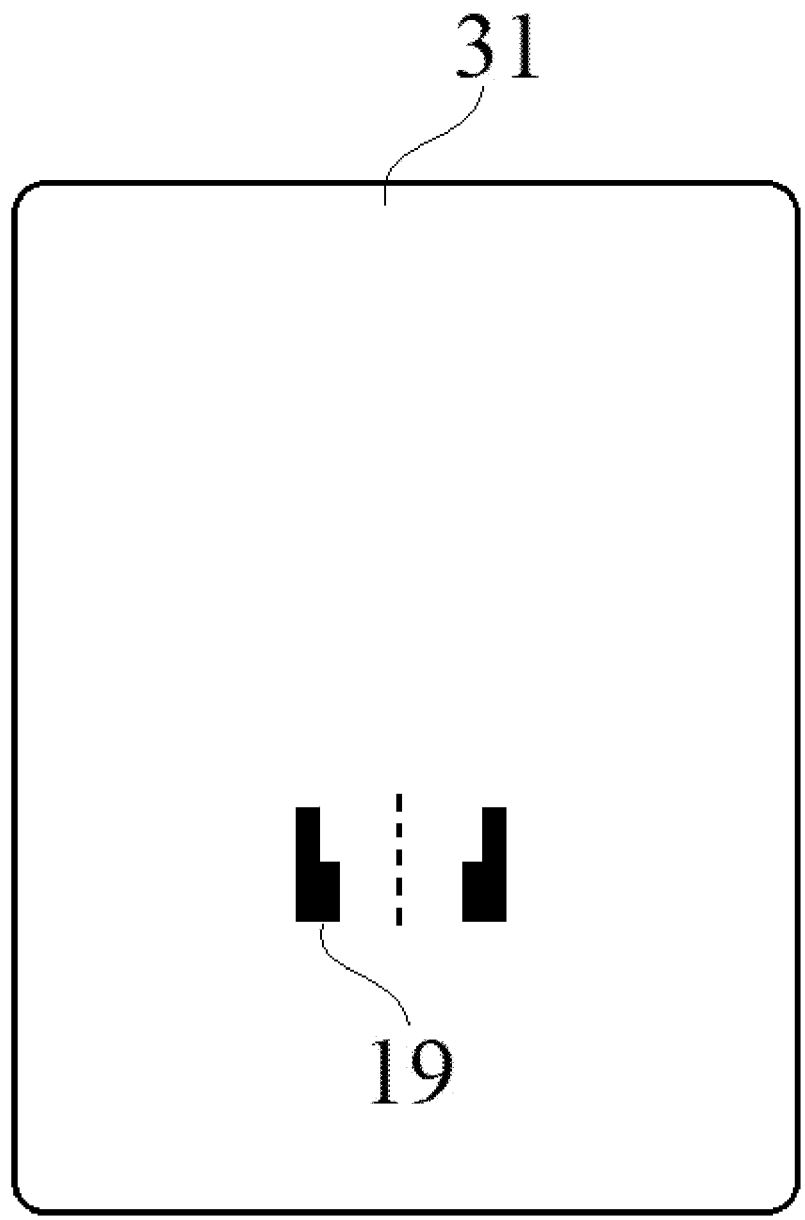
Figure 8:
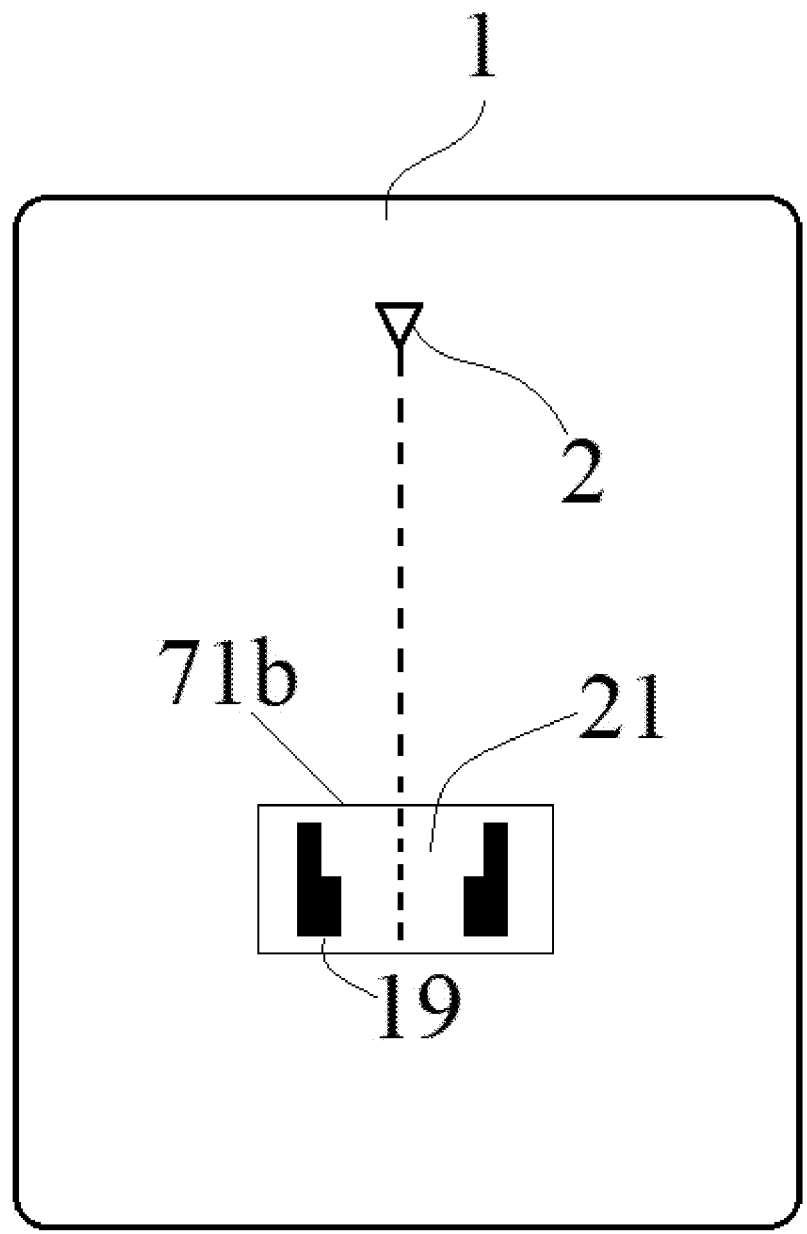
FIG. 8 schematically illustrates an apparatus of charged-particle beam using an electrode assembly forming a non-cylindrical central channel space as a deflector in accordance with an exemplary embodiment of the present invention.
Figure 9:
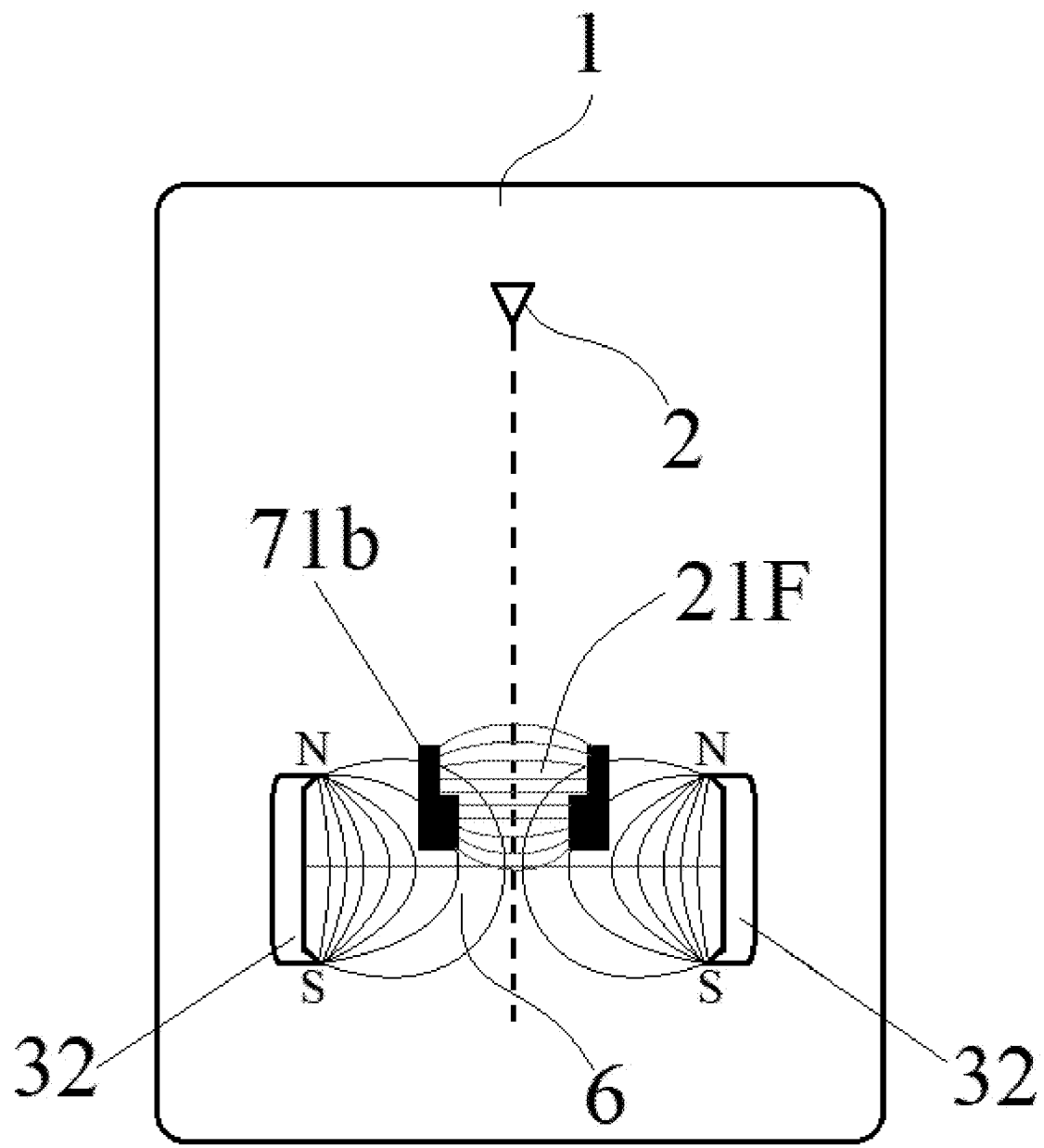
FIG. 9 schematically illustrates an apparatus of charged-particle beam using an electrode assembly forming a non-cylindrical central channel space which is completely or partially immersed in a magnetic field in accordance with an exemplary embodiment of the present invention.

Various embodiments of the invention provide a general electronic apparatus/device 31 that includes the electrode assembly 19 with non-cylindrical central channel space 21, as shown in FIG. 7. Examples of electronic apparatus/device 31 include, but are not limited to, cathode-ray tube (CRT), an apparatus of charged-particle beam such as electron microscope and an electron beam lithographical apparatus, and analytical instruments. For example, an apparatus of charged-particle beam 1 as shown in FIG. 8 may include a source 2 of charged particles configured to emit a beam of charged particles along a primary axis (e.g. z axis), and a deflector such as an electrostatic deflector 71b including the electrode assembly 19 as described above. The deflector 71b is configured to deflect the beam when the beam travels through the central channel space 21. As shown in FIG. 9, the apparatus of charged-particle beam 1 may further include a magnetic field generator 32 configured to generate a magnetic field 6, sometimes known as magnetic lens field 6 or simply magnetic lens 6. The central channel space 21 is completely or partially immersed in the magnetic field 6 so that an electrical field 21F within the central channel space 21 is co-optimized or coupled with the magnetic field 6, as shown in FIGS. 9 and 17-19. The field pattern in the central channel space 21 is complex and is calculated to minimize the introduction of aberrations into the beam when deflecting the primary beam. Generally, this optimization or co-optimization is carried out by numerical methods on digital computer and seeks to maintain the circular shape of the beam at maximum deflection from the Z-axis. As will be described in detail, the magnetic field generator 32 may be a magnetic objective lens, and the electrical field 21F within the central channel space 21 is co-optimized or coupled with the magnetic field 6 for reducing aberration(s) such as distortion, field curvature, astigmatism, and chromatic aberration, after the beam passes through the central channel space 21. Alternatively or additionally, the magnetic field generator 32 may be a magnetic condenser.

Figure 10:
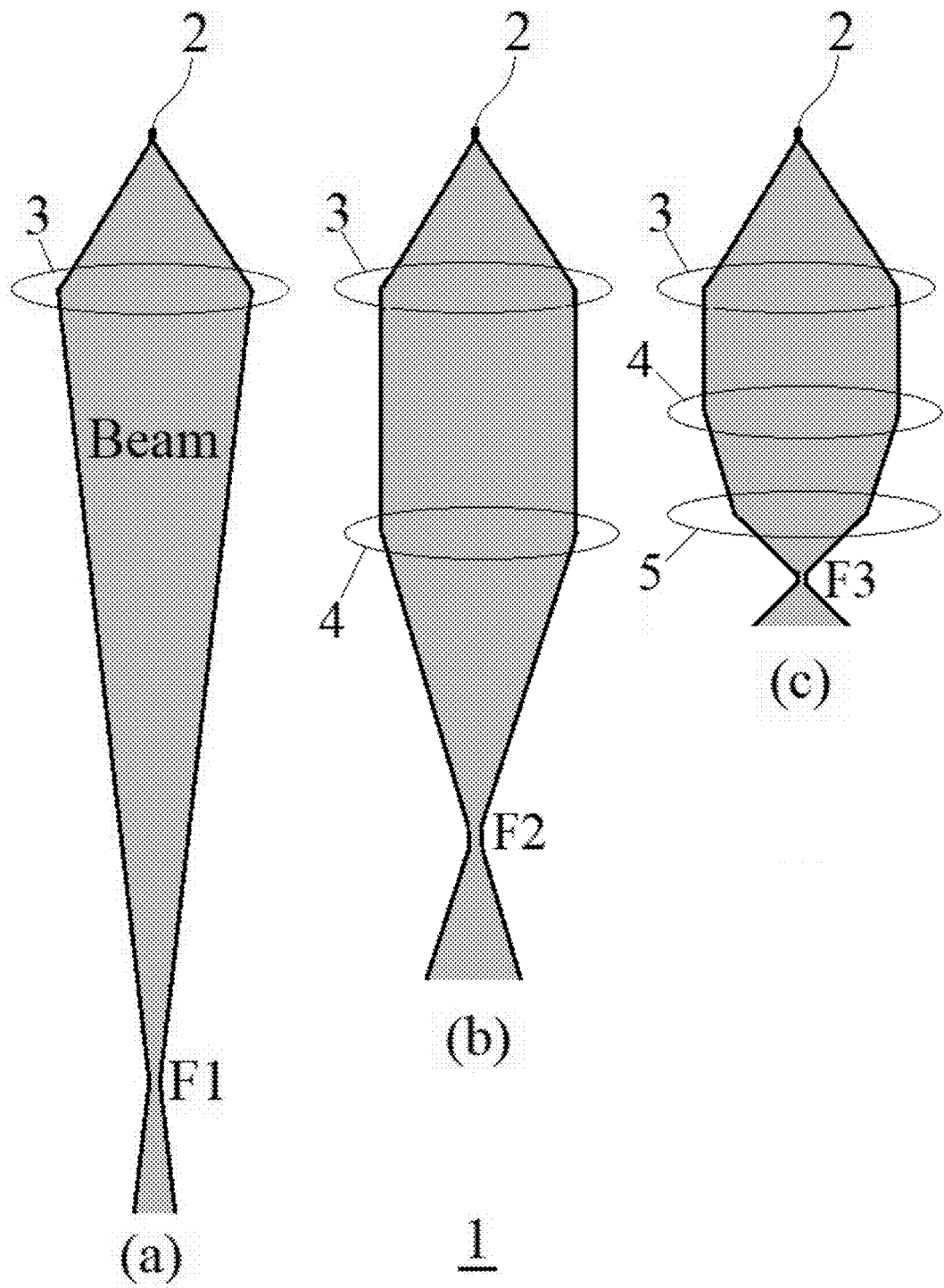
FIG. 10 schematically illustrates the formation of co-condensers which can be used with the electrode assembly (deflector) in an apparatus of charged-particle beam in accordance with an exemplary embodiment of the present invention.
Figure 11:
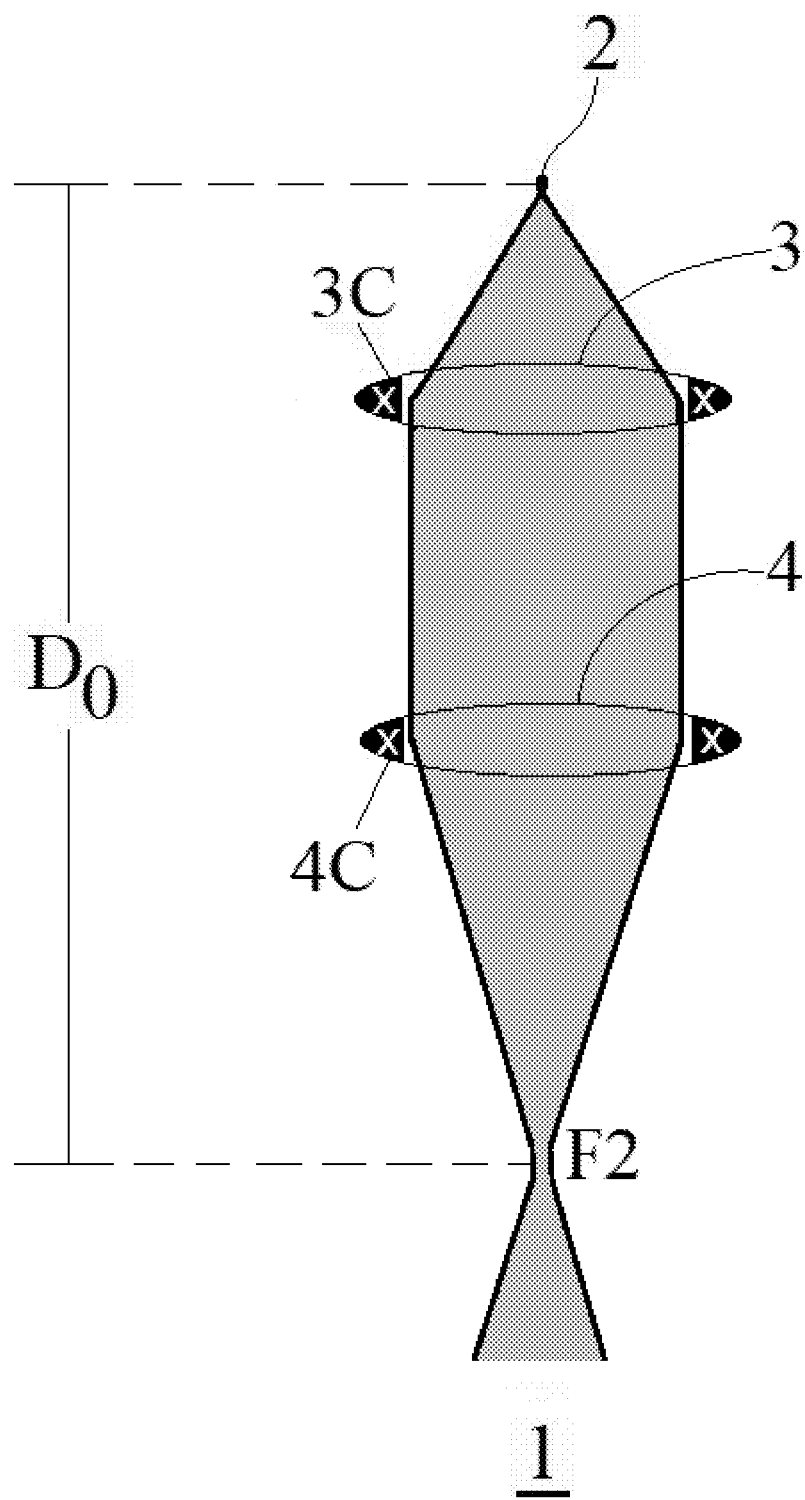
FIG. 11 shows two co-condensers with magnetic coils which can be used with the electrode assembly (deflector) in an apparatus of charged-particle beam in accordance with an exemplary embodiment of the present invention.

In the following exemplary embodiments, the deflector 71b is used with con-condensers as shown in FIGS. 10-11. The deflector 71b may also be a part of the deflection system 7 such as macroscopic deflection sub-system 71 shown in FIGS. 12-19.

In an apparatus of charged-particle beam such as an electron microscope (e.g. STEM), the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

In an apparatus 1 of charged-particle beam as shown in FIG. 10, a source 2 of charged particles is configured to emit a beam of charged particles. The source 2 may be for example an electron gun with a tungsten filament or a lanthanum hexaboride ($LaB_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

Generally, a condenser lens forms an image of the primary electron beam source for an objective lens, and the objective lens focuses the condenser lens image onto a specimen. Transmitted, secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

In the present invention, the term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 10, the beam does not have any crossover spot between any two of the two or more magnetic condensers within a set of co-condensers.

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance D0 between spot F2 and source 2 remains unchanged. By the same token, crossover spot F3 may be kept stationary relative to the source 2, i.e. the distance D0 between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 10 with only two magnetic condensers (3, 4) configured to coherently focus the beam to a single crossover spot F2.

Referring to FIG. 11, the only two magnetic condensers (3, 4) include a distal magnetic condenser 4 which is distal to the source 2, and a proximal magnetic condenser 3 that is located between the source 2 and the distal magnetic condenser 4. The proximal magnetic condenser 3 comprises a magnetic coil 3C driven by a coil current I1; and the distal magnetic condenser 4 comprises a magnetic coil 4C driven by a coil current I2. Generally, both coil currents I1 and I2 are greater than 0 (>0).

In preferred embodiments of the invention, coil currents I1 and I2 are configured to position single crossover spot F2 at a fixed position, i.e. maintain a predetermined distance D0 from source 2. With the "Fixed F2" condition being met, the size A of the crossover spot F2 may be increased by increasing coil current I1 and/or decreasing coil current I2; and decreased by decreasing coil current I1 and/or increasing coil current I2. The size A of the crossover spot F2 will be minimized when coil current I1 reaches its minimal value while coil current I2 reaches its maximal value. The size A is maximized when coil current I2 reaches its minimal value while I1 reaches its maximal value. There is no special limitation on the maximized size A, it may be smaller than, equal to, or bigger than the size of the source 2.

Figure 12:
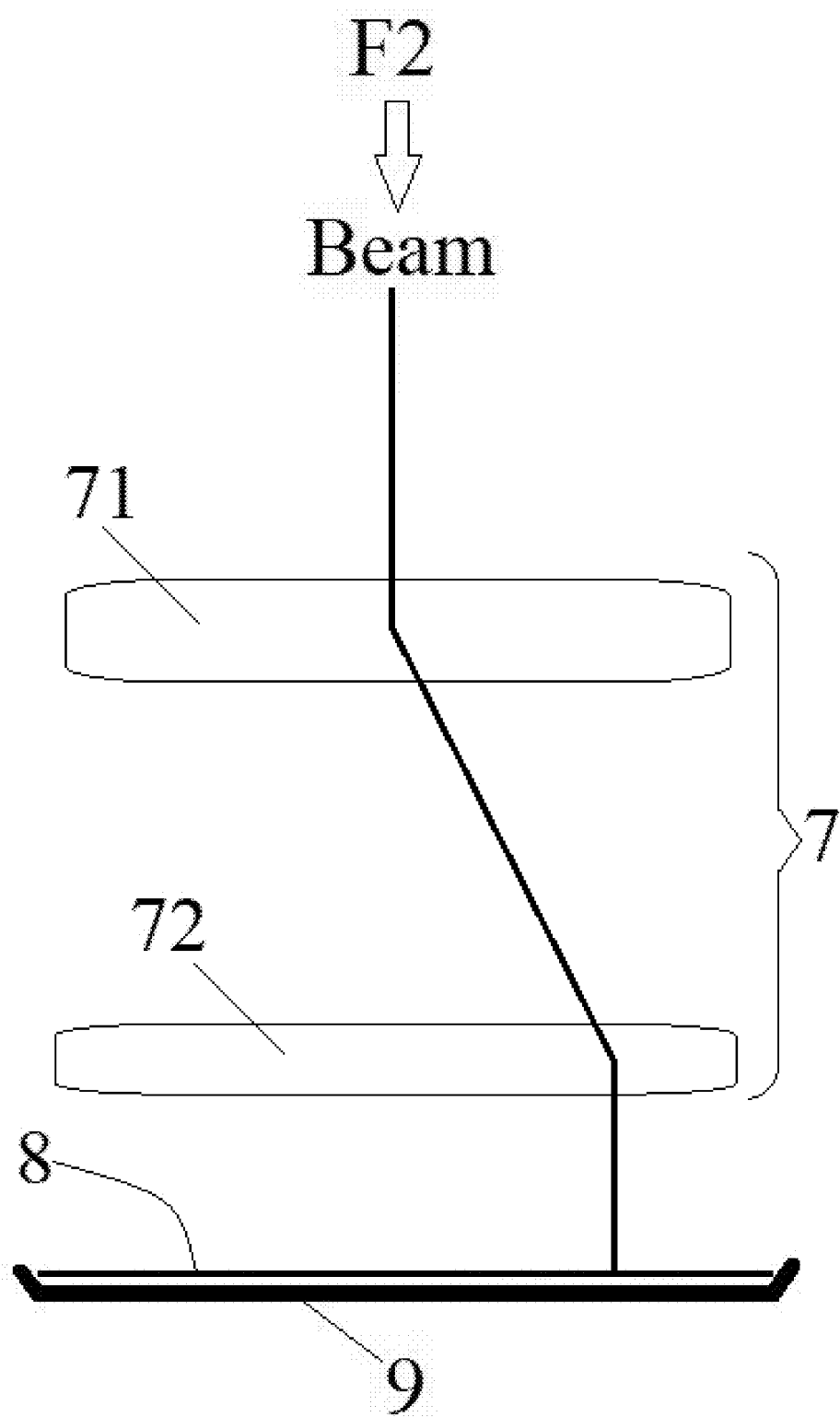
FIG. 12 illustrates an apparatus of charged-particle beam with a magnetic objective lens and a deflection system including the electrode assembly (deflector) in accordance with an exemplary embodiment of the present invention.
Figure 17:
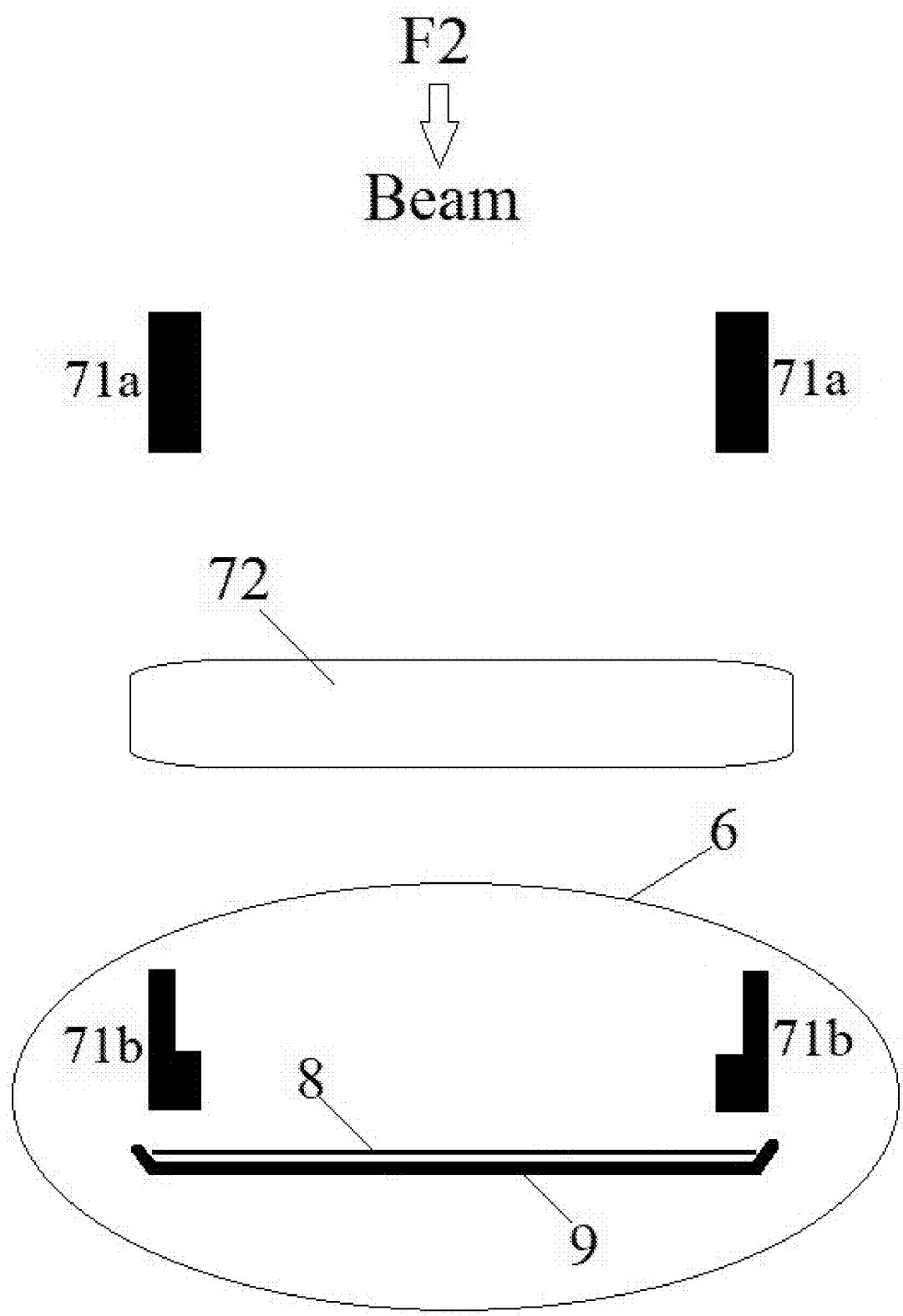
FIG. 17 schematically illustrates the configuration of a macroscopic deflection sub-system including the electrode assembly (deflector) in accordance with an exemplary embodiment of the present invention.
Figure 18:
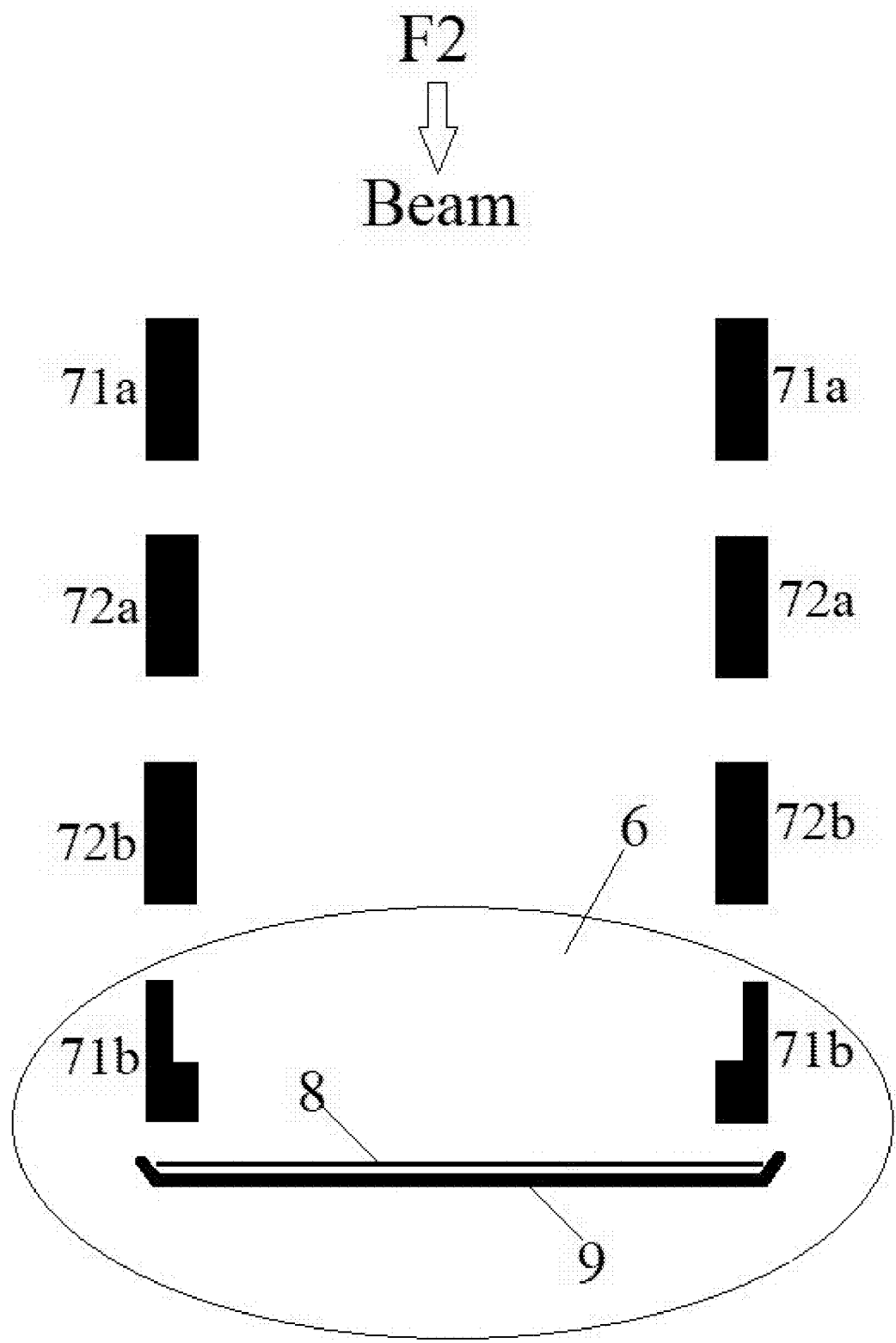
FIG. 18 schematically illustrates the configuration of a microscopic deflection sub-system in accordance with an exemplary embodiment of the present invention.
Figure 19:
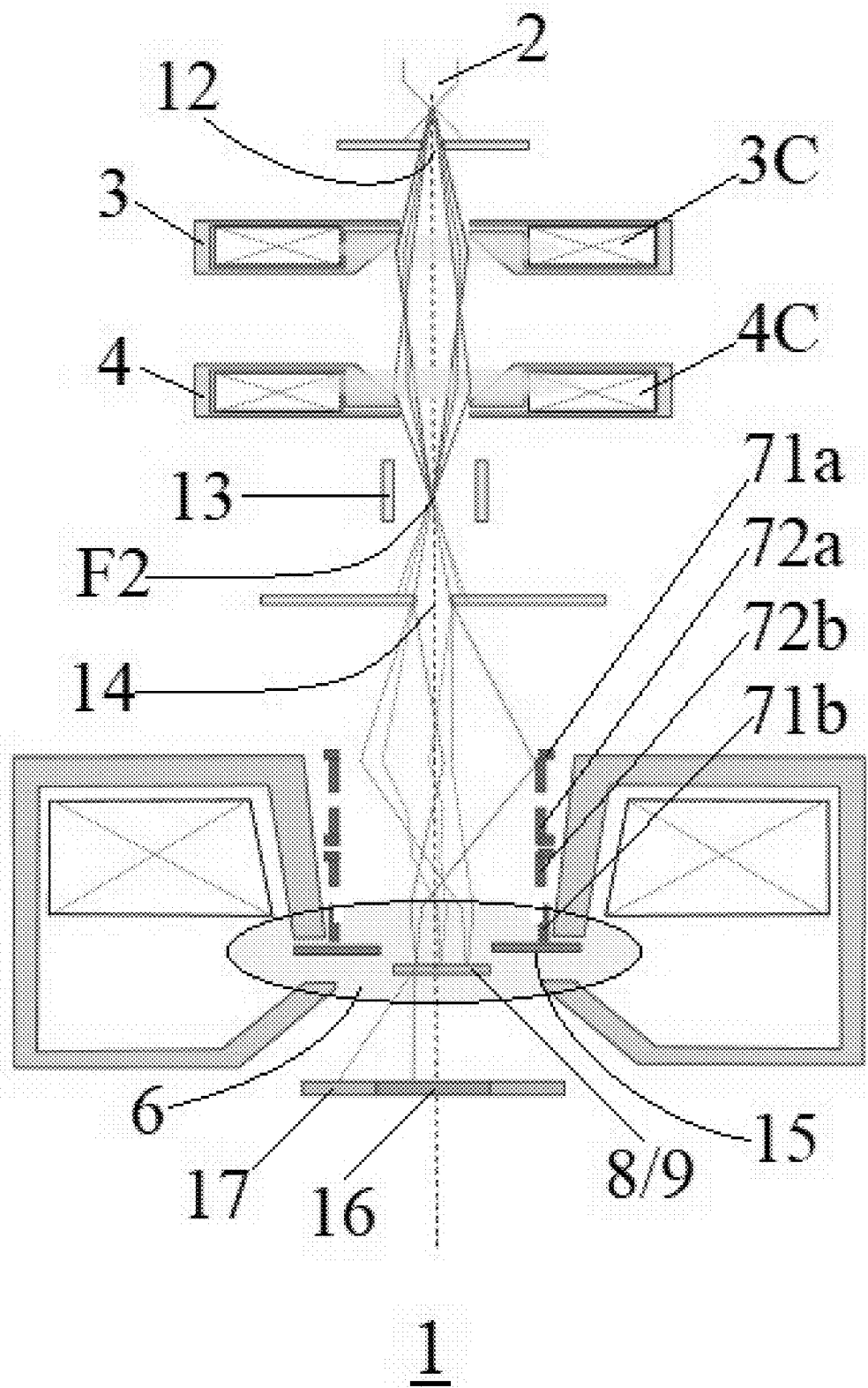
FIG. 19 shows an apparatus of charged-particle beam with two co-condensers and the electrode assembly (deflector) in accordance with an exemplary embodiment of the present invention.

In various exemplary embodiments as shown in FIG. 12, the apparatus of charged-particle beam according to the invention may include a magnetic objective lens 6 (as shown in FIGS. 17-19) and a deflection system 7 including the electrode assembly (deflector) of the present invention, which are downstream with respect to the single crossover spot F (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

A magnetic lens may include a magnetic material and exciting coils for providing magnetomotive force to a magnetic circuit having field lines through the magnetic material and between pole faces.

For the deflection system 7, it may include a macroscopic deflection sub-system 71 and a microscopic deflection sub-system 72, and the sub-system 71 may include the electrode assembly (deflector) of the present invention. The deflection system 7 causes the beam to position at, and scan across, a large field of view (FOV) on a specimen plane 8 of a specimen under examination in a specimen holder 9 and one or more small FOVs within the large FOV.

Figure 13:
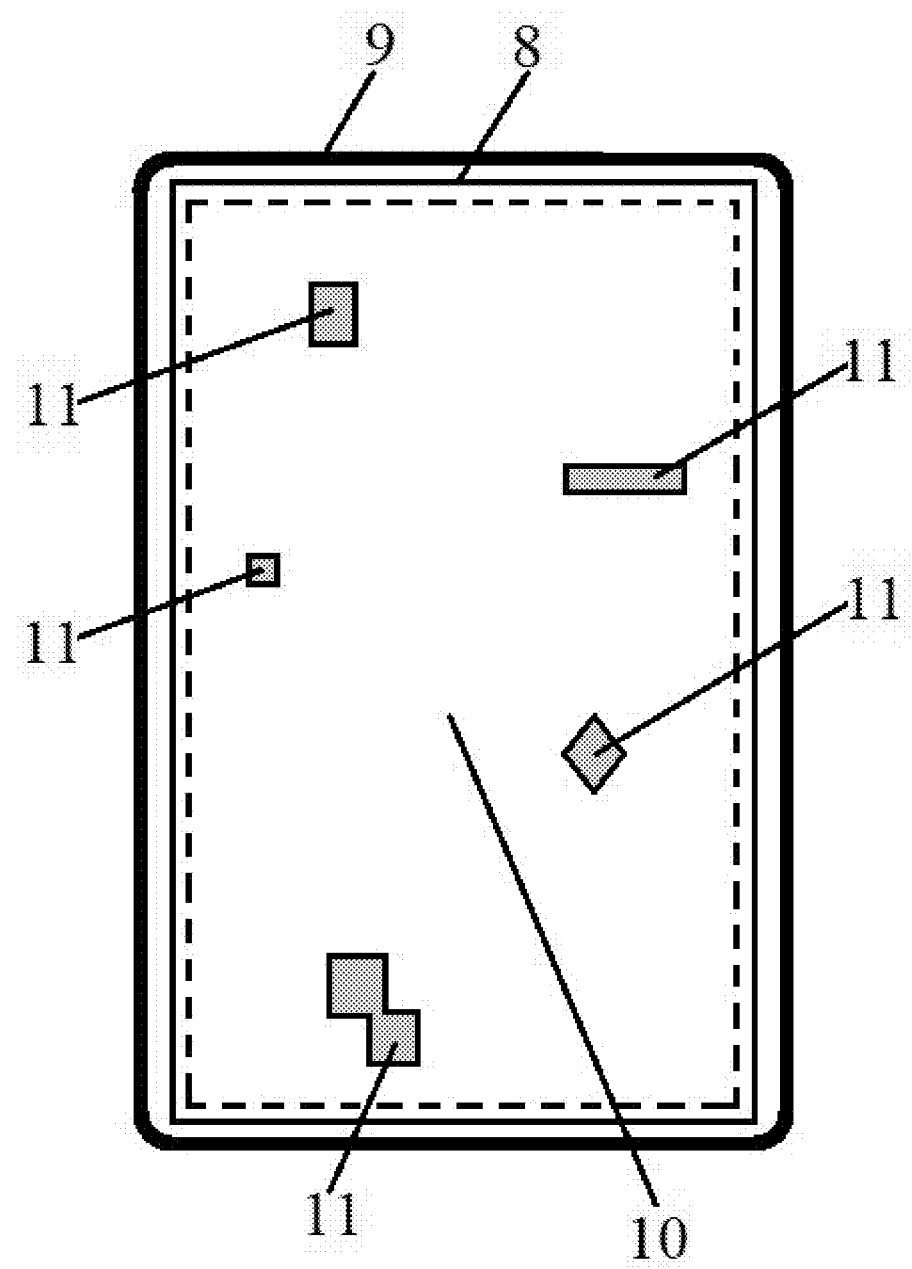
FIG. 13 demonstrates a single large field of view (FOV) on the specimen plane of the apparatus with a deflection system including the electrode assembly (deflector) in accordance with an exemplary embodiment of the present invention.
Figure 14:
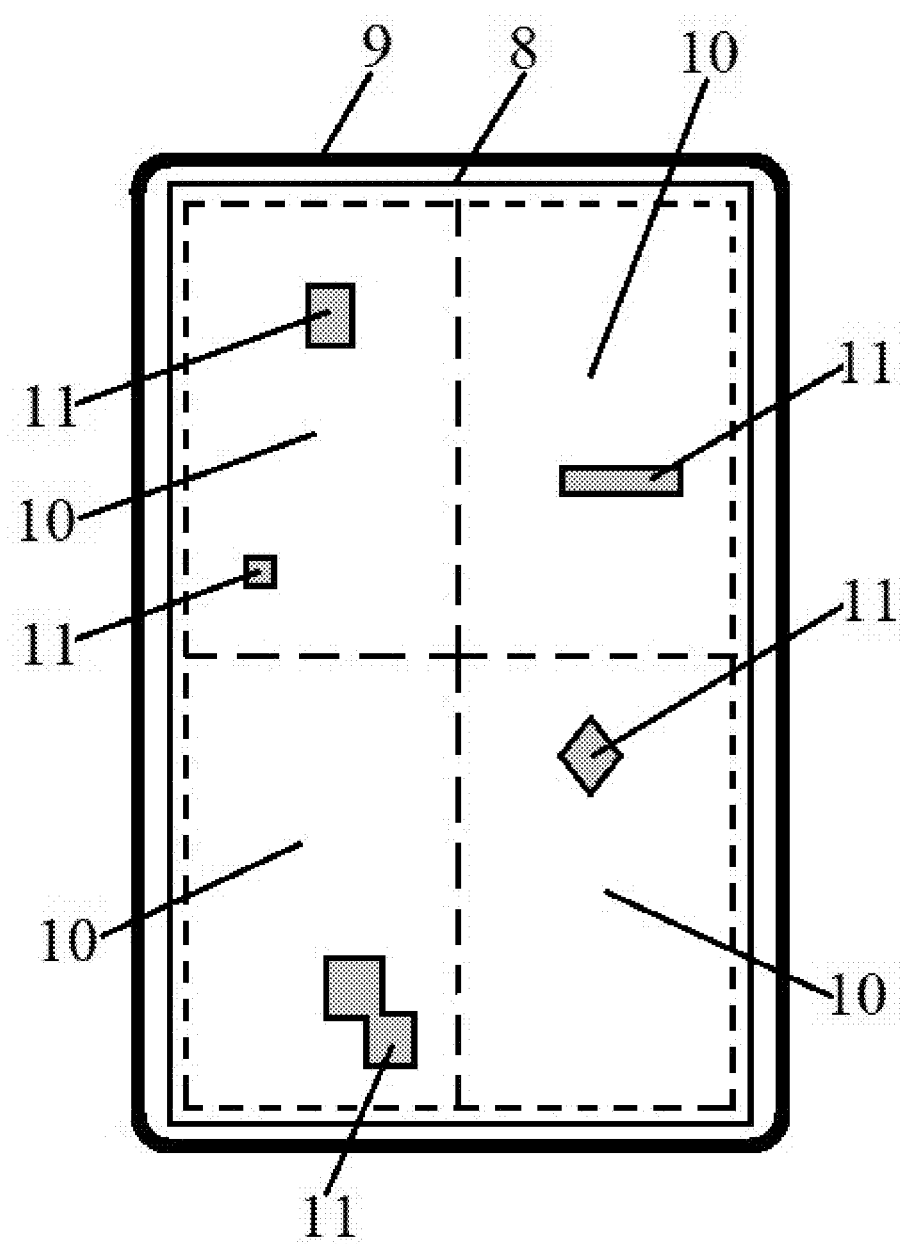
FIG. 14 demonstrates multiple large FOVs on the specimen plane of the apparatus with a deflection system including the electrode assembly (deflector) in accordance with an exemplary embodiment of the present invention.

As shown in FIGS. 13 and 14, the macroscopic deflection sub-system 71 causes the beam to scan across a large field of view (FOV) 10 on the specimen plane 8 of the specimen holder 9, and the microscopic sub-deflection system 72 causes the beam to position at, and scan across, one or more small FOVs 11 within a large FOV. As shown in FIG. 13, the specimen plane 8 may contain only one large FOV 10, which may contain zero, one, two, three or more small FOVs 11. In FIG. 14, the specimen plane 8 may contain two, three or more large FOVs 10, each of which may contain zero, one, two, three or more small FOVs 11.

Figure 15:
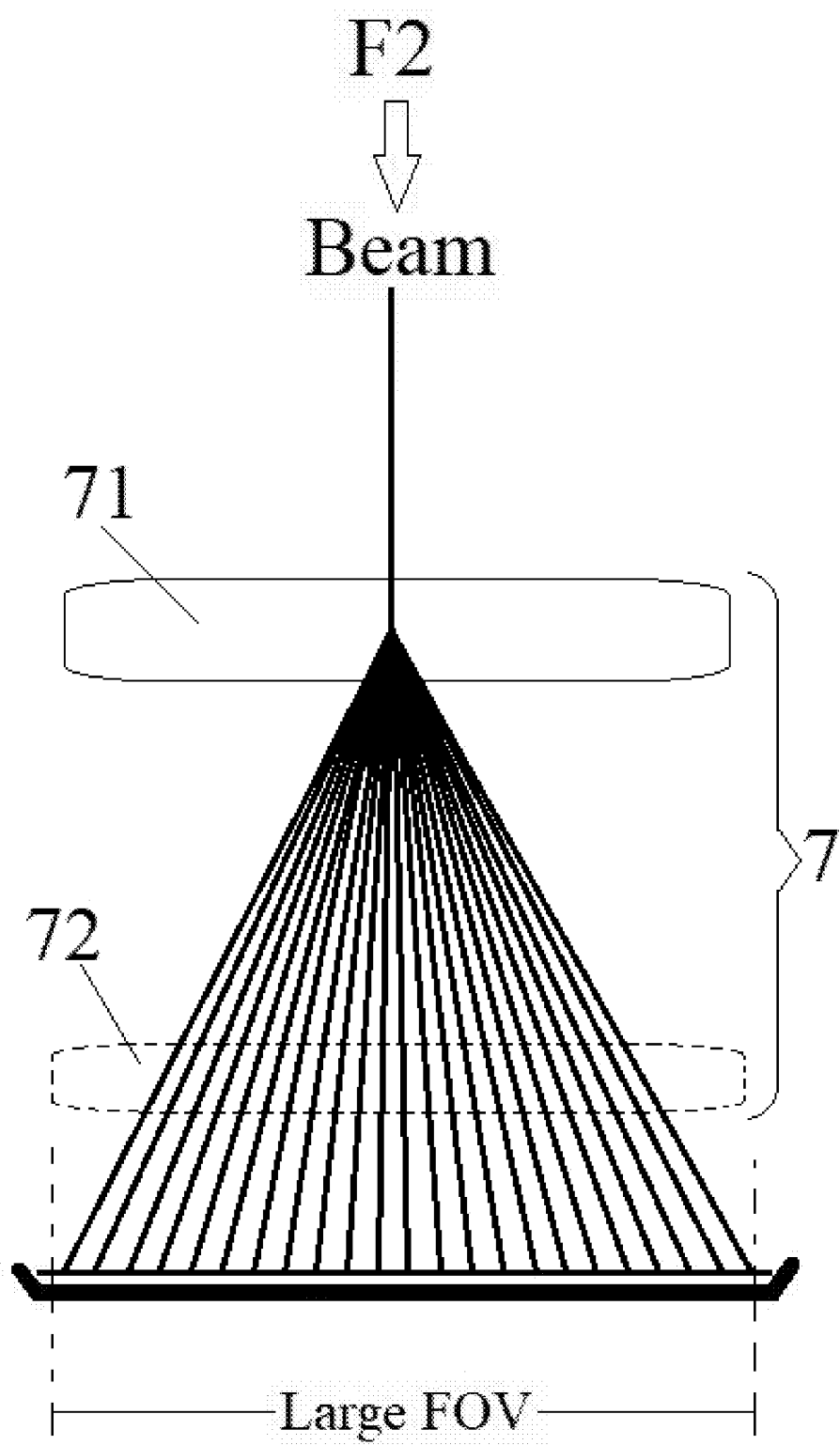
FIG. 15 illustrates a macroscopic deflection sub-system including the electrode assembly (deflector) in accordance with an exemplary embodiment of the present invention that alone causes the beam to scan across a large FOV.

In the first step of an examination process as shown in FIG. 15, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 16:
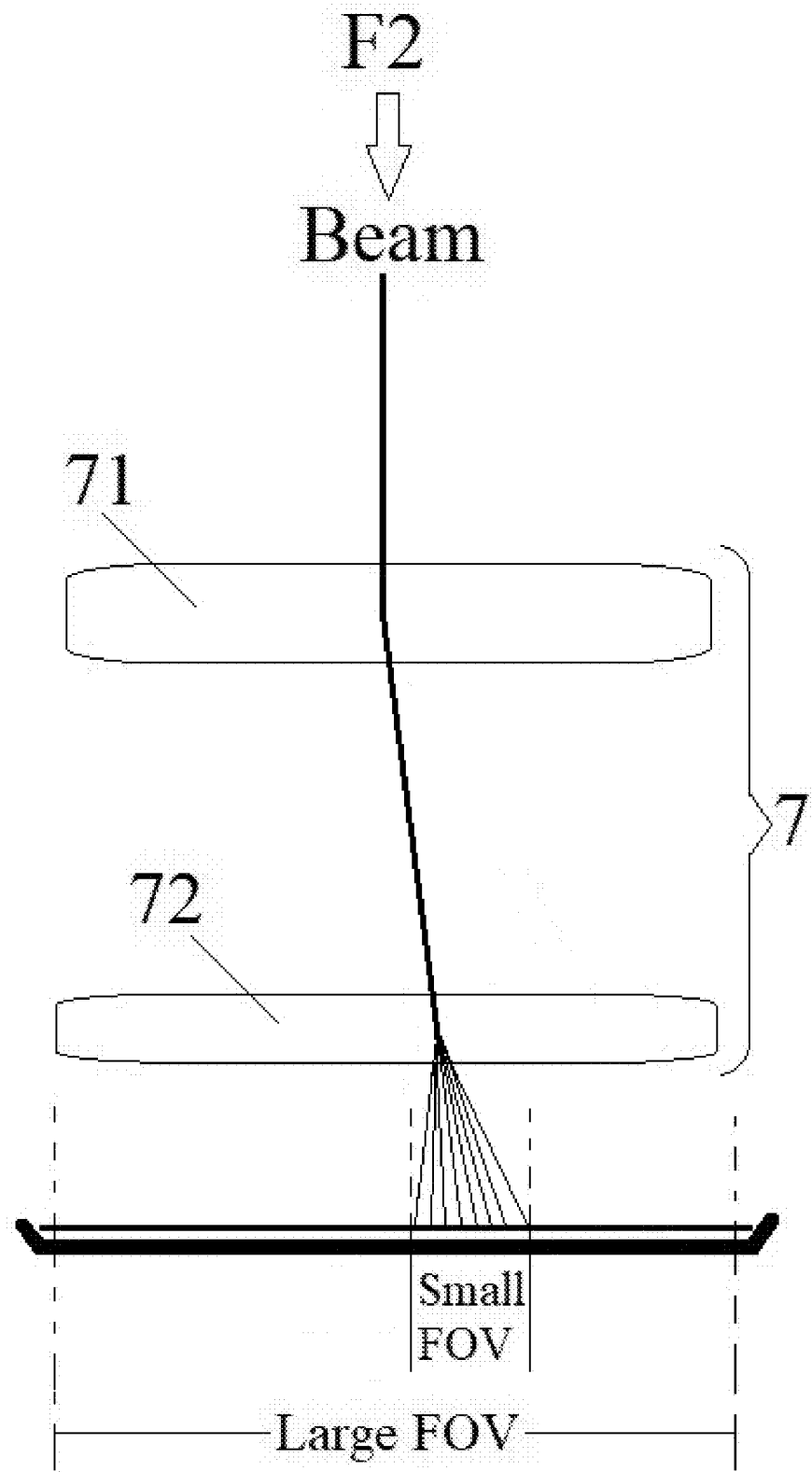
FIG. 16 illustrates a microscopic deflection sub-system causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection sub-system 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 16, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection sub-system 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 um to 200 um×200 um in size with a resolution of 0.5-20 nm. For example, the large FOV 10 may have a size of 100 um×100 um with a resolution of 8 nm. The small FOV 11 (e.g. POI, or area of interest) is also adjustable, and it may range from 0.5 um×0.5 um to 5 um×5 um in size with a resolution of 0.5-2 nm. For example, the small FOV may have a size of 5 um×5 um with a resolution of 0.5 nm.

As shown in FIG. 17, the macroscopic deflection sub-system 71 may include an upper deflector 71a, and a lower deflector 71b which includes the electrode assembly of the present invention. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection sub-system 71. As shown in FIG. 18, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 10 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 19, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to holds the deflectors, and the structure is inserted into the bucket-shaped space of the lens system thus making assembly easier.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 20:
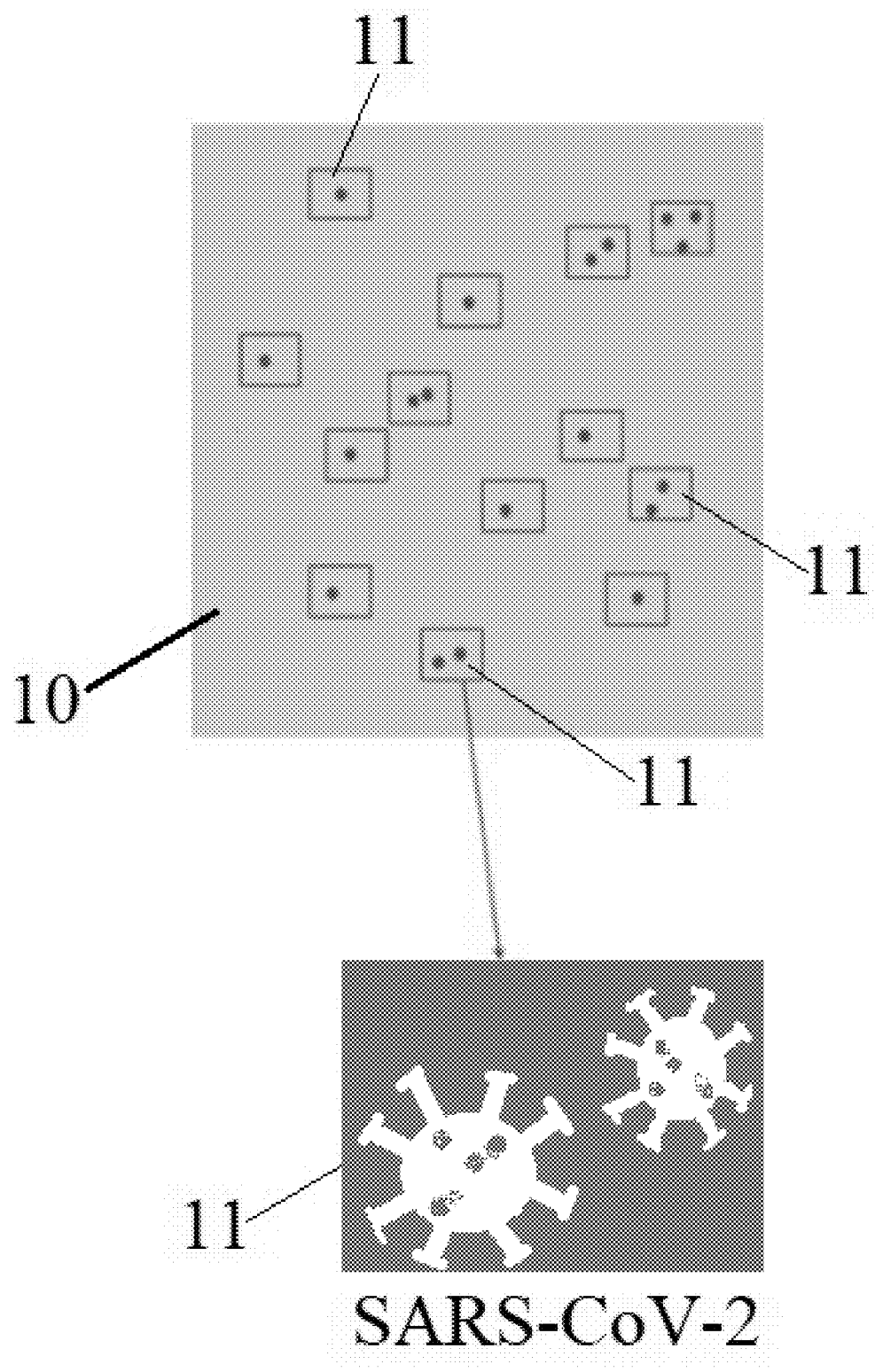
FIG. 20 shows the image of a biological sample in a large FOV with low resolution and a small FOV with high resolution in accordance with an exemplary embodiment of the present invention.

The novel EM column system as shown in FIG. 19 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4). The algorithm will detect related POI (pattern of interesting) and record related location(s). As shown in FIG. 20, the algorithm can detect related POI (pattern of interesting) such as the morphological features of Covid-19 virus (SARS-CoV-2) in a biological sample and record their location(s). Then the software will switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 20, an image of Covid-19 virus (SARS-CoV-2) with a high resolution is acquired. A software system can combine BSE, DF, BF's images from TEM/STEM system and use a machine learning (ML) algorithm to generate an enhanced image with differenced image resolution. Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An apparatus of charged-particle beam comprising:
a source of charged particles configured to emit a beam of charged particles along a primary axis or z axis,
a magnetic field generator configured to generate a magnetic field,
a macroscopic deflection sub-system including an upper deflector and a lower deflector, and
a microscopic deflection sub-system located between the upper deflector and the lower deflector of the macroscopic deflection system, wherein the microscopic deflection sub-system includes an upper deflector and a lower deflector, wherein the lower deflector of the macroscopic deflection sub-system includes an electrode assembly that comprises two or more electrodes arranged around a primary axis or z axis, a central channel space having a boundary surface that is axially symmetrical around the primary axis;

wherein the boundary surface is different from a single right cylindrical surface (or wherein at least two round cross-sections of the central channel space along planes in parallel with the x-y plane have different diameters);

wherein each of the electrodes has a body and a front face with a facial surface, and wherein the facial surface of each electrode overlaps (or conforms to) a portion of the boundary surface, and the entire body of each electrode remains outside the central channel space;

wherein the lower deflector of the macroscopic deflection sub-system is configured to deflect the beam when the beam travels through the central channel space;

wherein said central channel space in the lower deflector of the macroscopic deflection sub-system is completely or partially immersed in the magnetic field so that an electrical field within said central channel space is co-optimized or coupled with the magnetic field; and wherein the upper deflector of the macroscopic deflection sub-system, the upper deflector of the microscopic deflection sub-system and the lower deflector of the microscopic deflection sub-system above the lower deflector of the macroscopic deflection sub-system are not immersed in the magnetic field.

2. The apparatus of charged-particle beam according to 1, further comprising (1) a specimen holder which is downstream with respect to the lower deflector of the macroscopic deflection sub-system and completely immersed in the magnetic field; and (2) a bright field (BF) detector and a dark field (DF) detector which are downstream with respect to the specimen holder for generating specimen images.

3. The apparatus of charged-particle beam according to 2, wherein the magnetic field generator is a magnetic objective lens, and the electrical field within the central channel space is co-optimized or coupled with the magnetic field for reducing aberrations including distortion, field curvature, astigmatism, and chromatic aberration, after the beam passes through the central channel space.

4. The apparatus of charged-particle beam according to 2, wherein the magnetic field generator is a magnetic condenser.

5. The apparatus of charged-particle beam according to 1, wherein the central channel space comprises
a first single right cylindrical segment with a diameter D1, and
a second single right cylindrical segment with a diameter D2;
wherein a shoulder in parallel to x-y plane connecting the first segment to the second segment; and
wherein D1>D2.

6. The apparatus of charged-particle beam according to 1, wherein the central channel space comprises
a first single right cylindrical segment with a diameter D1,
a second single right cylindrical segment with a diameter D2,
a third single right cylindrical segment with a diameter D3,
a first shoulder in parallel to x-y plane connecting the first segment to the second segment; and
a second shoulder in parallel to x-y plane connecting the second segment to the third segment; and
wherein D1>D2>D3.

7. The apparatus of charged-particle beam according to 1, wherein the central channel space comprises a truncated cone segment with a diameter decreasing from D1 to D2, which is continuously transitioned to a single right cylindrical segment with a diameter D2, and D1>D2.

8. The apparatus of charged-particle beam according to 1, wherein the central channel space comprises a trumpet-shaped segment with a diameter decreasing from D1 to D2, which is continuously transitioned to a single right cylindrical segment with a diameter D2, and D1>D2.

9. The apparatus of charged-particle beam according to 1, which is an electron microscope.

* * * * *